United States Patent [19]

Boys et al.

[11] Patent Number: 4,500,408
[45] Date of Patent: Feb. 19, 1985

[54] APPARATUS FOR AND METHOD OF CONTROLLING SPUTTER COATING

[75] Inventors: Donald R. Boys, Cupertino; Robert M. Smith, San Jose, both of Calif.

[73] Assignee: Varian Associates, Inc., Palo Alto, Calif.

[21] Appl. No.: 564,776

[22] Filed: Dec. 27, 1983

Related U.S. Application Data

[63] Continuation of Ser. No. 515,246, Jul. 19, 1983, abandoned.

[51] Int. Cl.³ .............................................. C23C 15/00
[52] U.S. Cl. .................................. 204/298; 204/192 R; 204/192 M
[58] Field of Search ............... 204/192 M, 192 R, 298

[56] References Cited

U.S. PATENT DOCUMENTS

| 3,878,085 | 4/1975 | Corbani | 204/298 |
|---|---|---|---|
| 3,956,093 | 5/1976 | McLeod | 204/298 |
| 4,043,889 | 8/1977 | Kochel | 204/192 R |
| 4,046,660 | 9/1977 | Fraser | 204/192 C |
| 4,060,470 | 11/1977 | Clarke | 204/192 R |
| 4,124,474 | 11/1978 | Bomchil et al. | 204/192 R |
| 4,155,825 | 5/1979 | Fournier | 204/298 |
| 4,162,954 | 7/1979 | Morrison, Jr. | 204/298 |
| 4,166,783 | 9/1979 | Turner | 204/192 R |
| 4,180,450 | 12/1979 | Morrison, Jr. | 204/298 |
| 4,204,936 | 5/1980 | Hartsough | 204/192 R |
| 4,219,397 | 8/1980 | Clarke | 204/298 |
| 4,239,611 | 12/1980 | Morrison, Jr. | 204/298 |
| 4,265,729 | 5/1981 | Morrison, Jr. | 204/298 |
| 4,282,083 | 8/1981 | Kertesz et al. | 204/298 |
| 4,299,678 | 11/1981 | Mechel | 204/192 M |
| 4,312,731 | 1/1982 | Morrison | 204/298 |
| 4,356,073 | 10/1982 | McKelvey | 204/298 |
| 4,370,217 | 1/1983 | Funaki | 204/298 |
| 4,376,025 | 3/1983 | Zega | 204/298 |
| 4,391,697 | 7/1983 | Morrison | 204/298 |
| 4,394,236 | 7/1983 | Robinson | 204/298 |
| 4,404,077 | 9/1983 | Fournier | 204/298 |
| 4,457,825 | 7/1984 | Lamont | 204/298 |

FOREIGN PATENT DOCUMENTS

| 2422808 | 11/1975 | Fed. Rep. of Germany | 204/298 |
|---|---|---|---|
| 2232832 | 1/1975 | France | 204/192 R |
| 47-37840 | 9/1972 | Japan | 204/298 |
| 2096177A | 10/1982 | United Kingdom | 204/298 |

OTHER PUBLICATIONS

Advances in High Rate Sputtering with Magnetron--Plasmatron Processing and Instrumentation, San Diego, Calif., Apr. 27, 1979, Schiller et al., pp. 455-467.

Primary Examiner—Arthur P. Demers
Attorney, Agent, or Firm—Stanley Z. Cole; Leon F. Herbert

[57] ABSTRACT

The magnetic field of a magnetron sputter coating apparatus is controlled in response to measurements of plasma parameters to control deposition parameters, such as sputter deposition rate and material deposition thickness profile. From time to time the apparatus is standardized to change preset values for parameters of the plasma to manage the deposition parameters.

58 Claims, 4 Drawing Figures

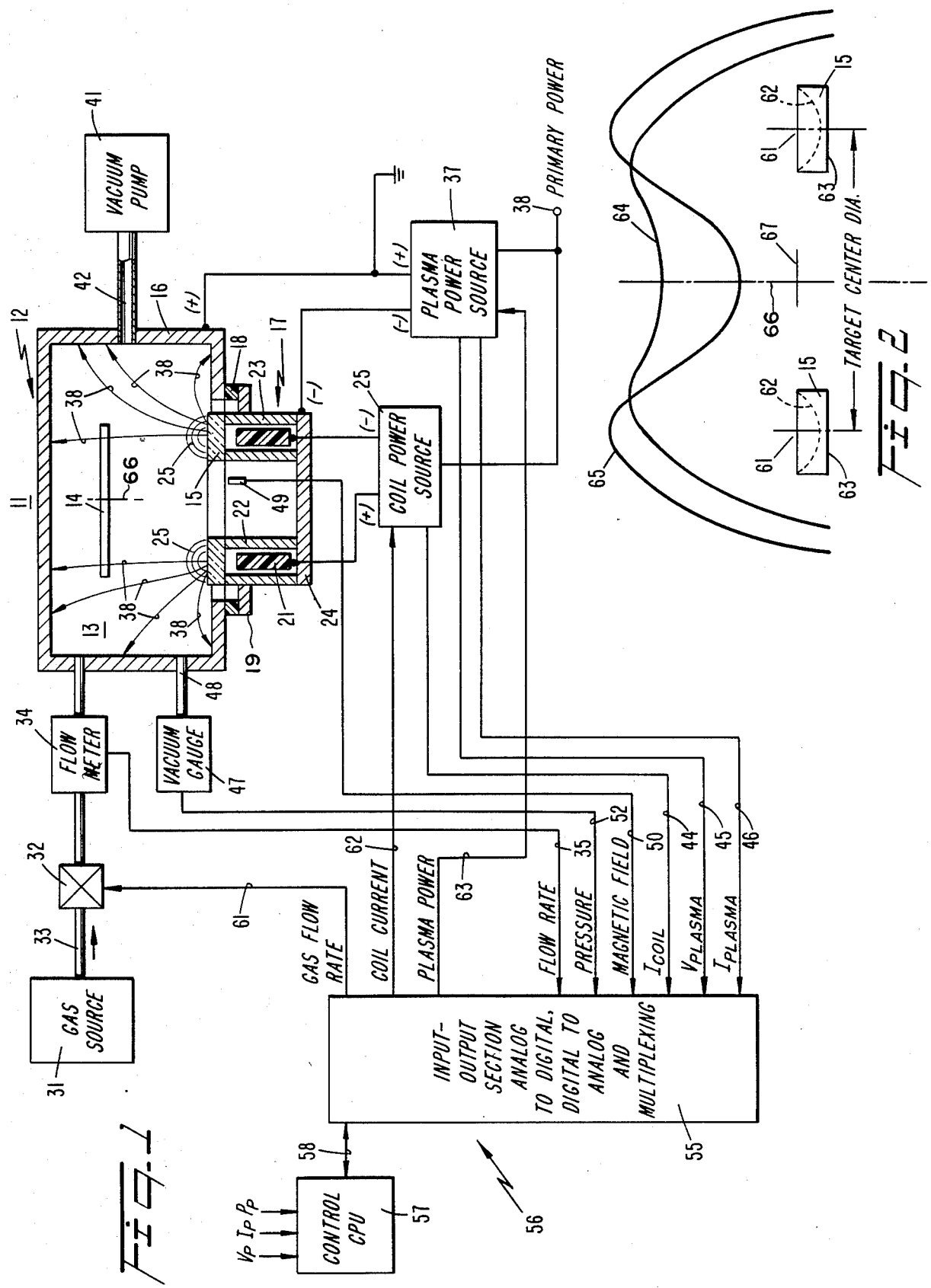

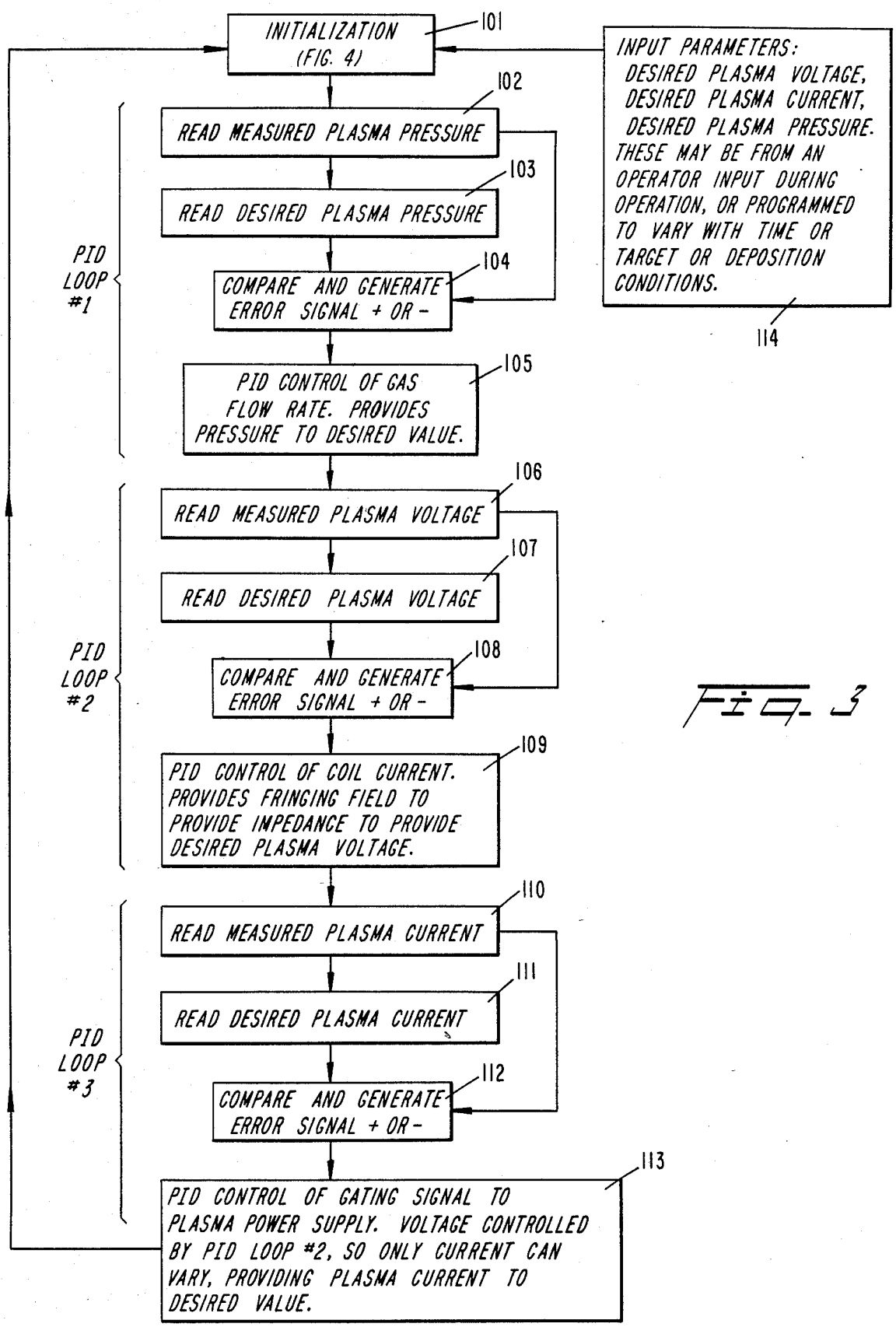

APPARATUS FOR AND METHOD OF CONTROLLING SPUTTER COATING

This application is a continuation of application Ser. No. 515,246, filed July 19, 1983, now abandoned.

TECHNICAL FIELD

The present invention relates generally to apparatus for and method of controlling sputter coating deposition and more particularly to a sputter coating apparatus and method wherein the impedance of a plasma is controlled.

BACKGROUND ART

Modern sputter coating devices are generally of the magnetron type, including a target cathode, an anode and a plasma having positively charged ions that bombard a surface of the target. In response to the bombardment, atoms are sputtered from the surface and propagate toward a substrate which is coated thereby. The plasma is formed by ionizing electrons moving between the cathode and anode through an inert gas. The ionizing electrons have a tendency to be confined in proximity to the target emitting surface by a magnetic field having lines of flux adjacent the target emitting surface. The confining magnetic field is at right angles to electric field lines extending between the anode and cathode. The right angle relationship between the electric and magnetic fields produces a magnetron effect of spiraling charged particles in the vicinity of the target.

In response to the target being bombarded by ions in the plasma, the target has a tendency to erode. Erosion of the target is non-uniform as a function of position on the target surface relative to an established plasma position. The non-uniform erosion of material from the target changes the path of material sputtered from the target to the substrate. Thus, the profile of sputtered material deposited on the substrate changes as a function of the amount of time that a particular target is in use.

It has been previously realized that the profile of sputtered material deposited on the substrate is a function of the profile of target erosion, which is in turn a function of the impedance of the plasma. It has also been previously realized that, to a certain extent, variations in the profile can be compensated by changing the plasma impedance. The plasma impedance is known to be a function of (1) the geometry of the sputter coating apparatus, (2) characteristics of the inert gas, e.g. the gas pressure, the ionization potential of the gas, contaminates of the gas and (3) the magnitude and geometry of the magnetic field. It has generally been assumed in the prior art that the sputter coating geometry is constant. In the prior art, the pressure of the inert gas has been controlled to compensate for expected changes in the profile of sputtered material attendant with erosion of the target. The magnitude and geometry of the magnetic field relative to the target base varied in an uncontrolled manner.

It has also been suggested in the commonly assigned U.S. Pat. No. 4,166,783 to Frederick T. Turner that compensation for aging and deterioration of the target can be controlled by a computer which responds to desired deposition rate information to control a plasma discharge. The computer regulates operation of a closed loop system wherein the power dissipated by an excitation source for the plasma is monitored from current drawn from the cathode and the cathode-anode voltage. The power dissipated in the sputtering discharge is corrected to maintain the desired deposition rate from the target cathode. The computer monitors an indication of the cumulative history of the target to update the correction periodically. The desired deposition rate is derived from information supplied to the computer independently. The computer determines a reference deposition rate level to which operation is stabilized. The computer determines from objective criteria based upon experience with a particular type target when the end of the useful life of a particular target cathode is reached.

While the prior art systems operate satisfactorily to a certain extent, there are refinements which can be made in controlling the magnetron sputter coating process, particularly for automatic control purposes. In the Turner patent, to correct for cathode erosion, the desired deposition rate, length of time that the cathode has been used, power applied to the plasma and the plasma pressure are assumed to be interrelated to control the power applied to the cathode but there is no on-line, closed loop control of the plasma impedance, although it is known that impedance changes with erosion because of changes in the position and geometry of the magnetic field relative to the eroded target surface. In numerous situations, it is desirable to provide online control for the plasma impedance because of variations associated with both the inert gas pressure and the magnetic field magnitude and configuration.

The magnetic field has a particular tendency to change during normal usage when the target is made of a magnetic material, i.e., a material having a high magnetic permeability. Magnetic targets are currently used for several purposes, one of which is to assist in the manufacture of magnetic disc memories having very high data density. To precisely control the thickness and uniformity of magnetic materials deposited on non-magnetic, generally aluminum substrates employed for magnetic disc memories, it is extremely important to control the manner in which the target material erodes, to control the deposition uniformity on the substrate throughout the life of a target.

The deposition profile of the sputtering material on the substrate can be maintained uniform as the target erodes only by control of the plasma impedance, unless complicated and expensive means are employed to manipulate the substrates during deposition. Control of the plasma impedance of a magnetic target is complicated because the magnetic material affects the amplitude and shape of the confining magnetic field. The magnetic target has a tendency to be a variable reluctance shunt for the magnetic field.

The reluctance of a magnetic circuit including the magnetic target has a tendency to change as a function of target temperature and erosion. When a relatively high magnetic permeability target is initially installed and is approximately at room temperature, it has a very low magnetic reluctance so that virtually all of the magnetic field applied thereto flows through the target and a fringing field in the target vicinity is relatively low. As the temperature of such a target increases, the magnetic permeability of the target has a tendency to decrease, due to the Curie point effect. The decrease in magnetic permeability due to the Curie point effect is a gradual phonomenon, whereby permeability decreases as a continuous function with increasing temperature, until a certain temperature is reached at which the target magnetic permeability drops virtually to zero. As the target erodes, the target crosssectional area decreases, with a resulting increase in magnetic flux density, i.e., $B = \Phi/A$ increases because A decreases, where: B equals magnetic flux density in the target,
Φ equals total magnetic flux applied to the target, and
A equals cross-sectional area of the target through which the magnetic flux flows.

The Curie point and erosion effects materially change the nature of the confining magnetic field in the vicinity of the target. As the temperature of the target increases, causing the magnetic permeability of the target to decrease, the target reluctance decreases; as the target reluctance increases there is a resulting increase in the fringing field in the vicinity of the target. Similarly, the decreased target area accompanying the target erosion causes the target reluctance to increase, with an increase in the fringing field in the target vicinity. As the fringing field in the target vicinity increases, the plasma in proximity to the target emitting surface is confined to a greater extent, i.e. to a smaller volume, because the magnetic field through the target decreases as the fringing magnetic field gradient increases. Thereby, the plasma impedance changes.

It is, therefore, an object of the present invention to provide a new and improved method of and apparatus for controlling a sputter coating magnetron depositing apparatus.

Another object of the invention is to provide a new and improved method of and apparatus for controlling a magnetron sputter coating depositing apparatus including a target that erodes as it is used during deposition.

Another object of the invention is to provide a new and improved method of and apparatus for controlling a magnetron sputter coating depositing apparatus wherein the tendency of a distribution pattern of atoms on a target substrate to change as the target erodes is compensated so as to be substantially overcome.

Another object of the present invention is to provide a new and improved apparatus for and method of controlling a magnetron sputter coating apparatus for depositing magnetic materials on a substrate.

Another object of the present invention is to provide a new and improved method of and apparatus for controlling a magnetron sputter coating depositing apparatus wherein the tendency of a magnetic target cathode to change the characteristics of a confining magnetic field as the target is eroded is compensated.

Another object of the present invention is to provide a new and improved apparatus for and method of compensating for the tendency of the reluctance patterns for magnetic target cathodes of magnetron sputter coating depositing apparatus to change as the target cathode is used.

Another object of the present invention is to provide a new and improved apparatus for and method of controlling a magnetron sputter coating depositing apparatus including a magnetic target cathode which has a tendency to have a variable reluctance path due to temperature variations.

Another object of the present invention is to provide a new and improved apparatus for and method of controlling a magnetron sputter coating depositing apparatus including a magnetic target cathode which has a tendency to have a variable reluctance path due to target erosion.

DISCLOSURE OF INVENTION

In accordance with the present invention, the electric impedance of the plasma of a magnetron sputter coating depositing apparatus is controlled by controlling the magnetic field intensity in response to plasma parameters having a tendency to vary. In a preferred embodiment, the magnetic field intensity is controlled by controlling the current amplitude applied to an electromagnet which establishes the magnetic field intensity. The current applied to the electromagnet is in turn controlled by comparing the plasma voltage, i.e., the voltage between the anode and cathode target, to a predetermined value. The predetermined value for the plasma voltage may be set by an operator or programmed to vary with time and target erosion, or in accordance with some other desired function. A first proportional-integral-differential (PID) controller for the electromagnet current responds to an error signal indicative of the deviation between the programmed and measured values of plasma voltage. The plasma current is controlled independently of the plasma voltage in response to the output of a second PID loop responsive to an error signal derived by comparing actual plasma current with a predetermined value; the second PID loop effectively controls plasma power. The second loop affects only plasma current because the first PID loop manages the plasma voltage.

Thus, the first closed PID loop results in operation at a predetermined value for plasma voltage, resulting from constant control of plasma impedance by varying the fringing field intensity through control of the electromagnet coil current. To complete the control scheme, the second PID loop controls the power gating signal to the plasma power supply in response to a predetermined value for plasma current. The predetermined current value may also be set by an operator or programmed to vary with time and target erosion, or in accordance with some other desired function. Because the first PID loop always results in a predetermined plasma voltage, any change in the power gating signal to the plasma power supply, which in the prior art would change both the plasma voltage and current, can now change only the plasma current. The power applied to the plasma is now a result of the selected and/or pre-programmed desired voltage and current. As a result, the plasma voltage and plasma current are both initially independently selected by an operator. With this extra dimension of control achieved with the present invention there is independent selection of both plasma voltage and plasma current. Thus, the present invention provides many choices for an operator to control deposition parameters to desired values.

In accordance with another aspect of the invention, the tendency for erosion of the emitting target surface to change a distribution pattern of atoms on a substrate is compensated by, from time to time, standardizing certain parameters of the depositing apparatus. While the apparatus is in the standardized condition, a response of the target is determined. The determined response is compared with a predetermined value of the response to determine when the target has eroded to such an extent as to require adjustment of plasma parameters, or to be considered exhausted. The determined response establishes set point values for the plasma voltage, current and the magnetic field. The established set point values are such that when the plasma parameters are controlled the tendency of the distribution pattern to change with target erosion is substantially overcome.

For a magnetic target, a predetermined magnetic field is supplied to the target while the apparatus is in the standardized condition. The amplitude of a fringing field in the vicinity of the target resulting from the predetermined field is sensed to establish the set point values. The standardized condition for the magnetic target is established without the plasma being ignited and while the cathode is at a stabilized, predetermined temperature.

For a non-magnetic target, the standardized condition is established with the plasma ignited and at a predetermined pressure and current. The coil current controlling the magnetic field is then controlled so the plasma voltage has a predetermined value. The magnitude of the coil current determines the life of the target cathode and the programmed values of plasma voltage, plasma current and coil current.

In accordance with another aspect of the invention, a magnetron sputtering method for depositing magnetic material on a substrate comprises applying to the target a magnetic field to saturate magnetic material a very small length of the target. Because part of the magnetic material of the target is saturated, a magnetic fringing field is established in proximity to the emitting surface of the target. The fringing field extends from and returns to separate target portions that are adjacent the saturated portion. These adjacent portions serve as extensions of pole structures of opposite polarity of the magnet structure of the magnetron device. The magnetic fringing field is the confining magnetic field in such a situation. The magnetic field is controlled in response to an indication of the plasma impedance. The target has a tendency to change temperature during operation in response to bombardment thereof. Thereby, the magnetic properties of the target have a tendency to change during operation. To compensate for the tendency of the magnetic field intensity to change as a function of temperature, the amplitude of the magnetic field is changed so that the fringing field configuration and intensity has a tendency to be constant on a short term basis, i.e., over an interval while the profile of atoms between the target and the substrate can be considered as constant.

In accordance with another aspect of the present invention, a magnetron sputter coating depositing apparatus includes a magnetic field sensor positioned in proximity to the target to sense a fringing field of the target. The plasma impedance is controlled in response to the magnetic field sensed by the magnetic field sensor. In a preferred embodiment, the magnetic field sensor is a Hall plate.

The above and still further objects, features and advantages of the present invention will become apparent upon consideration of the following detailed description of several specific embodiments thereof, especially when taken in conjunction with the accompanying drawings.

BRIEF DESCRIPTION OF THE DRAWINGS

FIG. 1 is a block diagram of an improved magnetron sputter coating apparatus and control equipment for performing the method of the invention;

FIG. 2 is an illustration helpful in understanding one of the problems solved by the invention;

FIG. 3 is a flow diagram of control provided by the invention; and

BEST MODE FOR CARRYING OUT THE INVENTION

Figure 4:
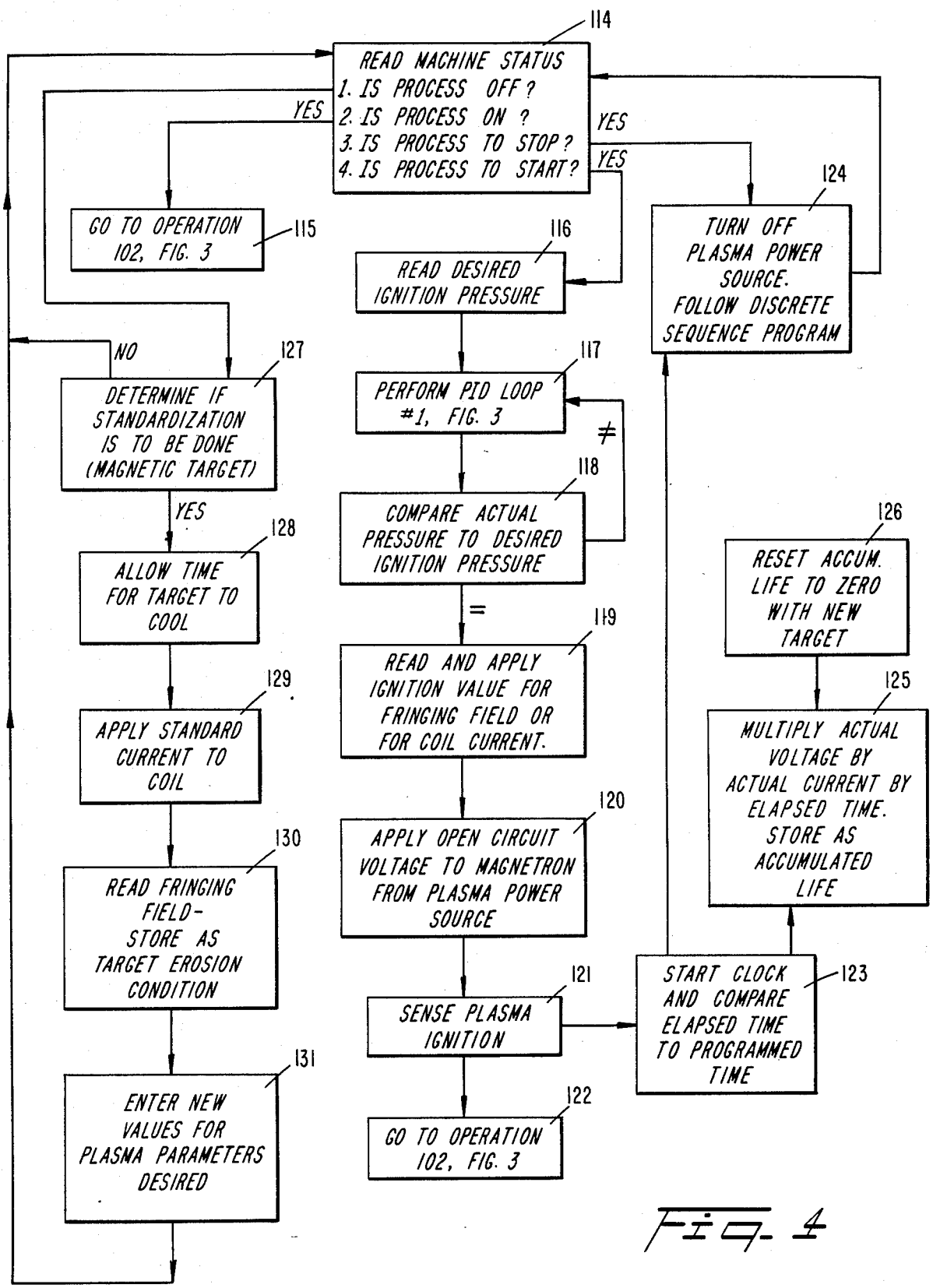
FIG. 4 is a flow diagram of initialization included in the flow diagram of FIG. 3.

Reference is now made to FIG. 1 of the drawing wherein magnetron sputtering apparatus 11 is illustrated as including vacuum chamber 12 containing enclosed sputter coating processing or depositing volume 13 in which substrate 14 is mounted by conventional means (not shown). For one application, wherein the apparatus is used to manufacture very high resolution magnetic discs of the type employed in computer memories, substrate 14 is made of a non-magnetic metal, such as aluminum. Magnetic and non-magnetic layers can be deposited on substrate 14 by the apparatus illustrated in FIG. 1 by suitable choice of materials for target cathode 15, initially having a planar emitting surface facing substrate 14; target 15 is part of cathode assembly 17. In the illustrated embodiments of the present invention, frequent mention is made to concentricity and axis of symmetry, and other terms relating to generally circular and annular construction because the cathode assembly of FIG. 1 is of circular and annular construction. The present invention is equally applicable to magnetron sources of other shapes, including those generally termed in the industry as planar magnetron devices. In the illustrated configuration cathode 15 is ring shaped.

Chamber 12 includes a metallic, electrically grounded, exterior housing 16 made of a material having high electric conductivity. In the illustrated configuration housing 16 is generally formed as a cylinder, having an axis concentric with substrate 14, in turn coaxial with ring target cathode 15. Anode housing 16 is electrically insulated from cathode assembly 17 by dielectric ring 18, concentric with the axis of housing 16. Ring 18 is fixedly mounted on non-magnetic ring 19, with both rings forming exterior portions of chamber 12.

Cathode assembly 17 includes means for supplying a variable, controllable magnetic field to target 15. The variable magnetic field applying means includes electromagnet coil or winding 21, wound concentric with the axis of cathode assembly 17 so that current flows circumferentially with respect to the common axis of the winding and the assembly. Winding 21 is surrounded by a low magnetic reluctance path including target 15, inner annularly shaped pole piece 22, outer annularly shaped pole piece 23, and horizontally extending disc pole piece 24. Pole piece 23 carries disc 19. Pole pieces 22, 23 and 24 are coaxial with the common axis of coil 21 and housing 16.

DC power source 25 supplies variable DC current to coil 21 to vary the magnetic field applied by assembly 17 to target electrode 15. In response to the DC current applied to coil 21, oppositely directed magnetic flux is induced in annular pole pieces 22 and 23 so that radially extending magnetic flux flows through target 15 and adjacent the emitting surface of target 15. In FIG. 1, it is assumed that the polarity of the current applied by source 25 to coil 21 is such that the magnetic flux flowing through target 15 on both sides of the axis of symmetry of housing 16 is radially outward. Conversely, the magnetic flux path through disc 24 is radially inward. The magnetic flux flowing through target 15 may establish fringing magnetic flux lines 25 adjacent the emitting surface of target 15. Flux lines 25 are generally of arcuate shape, and extend only slightly above the emitting surface of target 15.

The magnitude of fringing flux lines 25 is dependent upon the nature of the magnetic properties of target 15 and on the amplitude of the current applied to coil 21. If, for example, target 15 is a non-magnetic material, the magnitude of the fringing field is similar to the magnitude of the field in the target, and the fringing field extends to a relatively large distance above the emitting surface of the target. If, however, target 15 is a magnetic material at a temperature that is considerably below the Curie point temperature of the material and the magnetic field applied thereto by coil 21 is considerably lower than the field required to saturate the target, almost all of the magnetic lines of flux induced by coil 21 in pole pieces 22-24 flow through the target, with a relatively small amplitude fringing field extending only a short distance above the target emitting surface. If, however, target 15 is at a sufficiently high temperature as to approach the Curie point thereof, the magnetic field from coil 21 has a tendency to saturate the target more readily. When the target is saturated, the magnetic reluctance thereof increases and there is a relatively large amplitude fringing magnetic field extending a relatively large distance above the target emitting surface. Substantial fringing flux lines 25 can also be produced if the target is at a relatively low temperature if the current supplied to coil 21 is sufficient to drive some of the magnetic material of target 15 into saturation. To assure that the magnetic material of target 15 saturates prior to the magnetic materials of pole pieces 22-24, the B-H curve of the pole pieces has a higher magnetic flux density saturation point than the target.

To establish a plasma in processing volume 13, an inert gas, typically argon, is supplied to the processing volume from pressurized inert gas source 31. The amount of gas flowing from source 31 into volume 13 is controlled by variable orifice servovalve 32 in conduit 33 between the source and volume. Flow meter 34 in conduit 33 derives an electric signal on lead 35, which signal has a magnitude indicative of the flow rate of gas from source 31 into volume 13.

The inert gas flowing from souce 31 to volume 13 is ionized as a result of electrons propagating through volume 13 from target cathode 15 to anode electrode 16, in response to the anode being positively biased with respect to the cathode. To these ends, DC plasma power source 37 has a grounded positive electrode connected to anode 16, and a negative, relatively high voltage electrode connected to cathode assembly 17. In response to the DC potential established between electrodes 15 and 16, electric field lines 38 are established. Electric field lines 38 are either generally straight or curved, with the generally straight electric lines generally subsisting between the portions of cathode 15 and anode 16 which are in line of sight with each other. The curved electric field lines subsist between adjacent portions of electrodes 15 and 16. Electric field lines 38 are at right angles to the magnetic field lines 25 established by coil 21, in combination with pole pieces 22-24 and target 15.

DC power sources 25 and 37 are supplied from a primary, AC power source connected to terminal 38. Generally, power source 25 derives a voltage that can vary within a small range and variable current that is supplied to coil 21, allowing compensation for changes in coil resistance due to temperature changes. Source 37 is controlled so that variable current and voltage can subsist between target cathode 15 and anode 16. DC sources 25 and 37 are utilized for targets 15 made of magnetic or non-magnetic electrically conductive material. If, however, target 15 is made of a dielectric material, source 37 is an RF source, while source 25 remains a DC source.

To maintain processing volume 13 at the desired pressure, high vacuum pump 41 is connected to processing volume 13 by way of conduit 42. In some situations, it may be desirable to control the rate at which pump 41 evacuates processing volume 13, in which case a variable pumping orifice (not shown) is connected in conduit 42 between pump 41 and volume 13.

Various parameters are monitored to assist in controlling the opening of valve 32, the current supplied by source 25 to coil 21, and the voltage, as well as current supplied by DC source 37 to target cathode 15 and anode 16. Source 25 includes a current transformer (not shown) for supplying lead 44 with a DC signal proportional to the current supplied by the source to coil 21. DC plasma power source 37 includes a current transformer (not shown) for supplying to lead 46 a DC signal proportional to the current supplied by source 37 between electrodes 15 and 16. Source 37 also includes voltage measuring circuitry (not shown) for supplying lead 45 with a signal indicative of the magnitude of the voltage applied by the source between electrodes 15 and 16. The pressure in processing area 13 is monitored by vacuum gauge 47, connected to processing volume 13 by way of conduit 48. Pressure gauge 47 supplies lead 52 with a DC signal having a magnitude proportional to the vacuum pressure in volume 13. The magnitude of the fringing magnetic flux field in the vicinity of target cathode 15 is monitored by Hall plate 49, located adjacent target 15, but outside of processing volume 13. Hall plate 49 is positioned in proximity to target 15 in such a way that the Hall plate supplies to lead 50 a DC signal proportional to the magnitude of the fringing field above the emitting surface of target 15. Flow meter 34 supplies a DC signal to lead 35 indicative of the flow rate of working gas flowing from pressurized gas source 31 to processing volume 13.

The signals on leads 35, 44-46, 50 and 52 are supplied to data processing input-output section 55, part of computer control system 56. Input-output section 55 includes a multiplexer (not shown) which supplies the signals on leads 35, 45-46, 50 and 52 one at a time to an analog to digital converter (not shown) in section 55. Input-output section 55 is connected to a control central processing unit (CPU) 57 of data processor 56 by way of multi-lead bus 58. Bus 58 is responsive to the output of the analog to digital converter in input-output section 55 to supply multibit input signals to CPU 57.

CPU 57 includes a conventional memory for storing a program and predetermined data for controlling the operation of sources 25 and 37, as well as orifice 32. CPU 57 is responsive to signals indicative of the desired voltage to be applied by source 37 between electrodes 15 and 16 and for the current to be supplied by source 37 between electrodes 15 and 16, as well as a desired value for the pressure in processing volume 13. The desired values for the voltage and current of source 37 and the pressure in volume 13 can be preset by an operator to initial values, or can be derived from the operator setting a desired rate of deposition for material from target cathode 15 to substrate 14. The set values for the voltage and current of source 37 and the pressure of processing volume 13 can be changed from time to time by the operator, but are preferably programmed to vary with the amount that a particular target 15 has eroded, to compensate for erosion of the target. The programmed values for the voltage and current of source 37 and the pressure in volume 13 are stored in the memory of CPU 57.

CPU 57 responds to the signals supplied to it by bus 58, as well as the signals supplied to it indicative of desired values for the plasma voltage and plasma current, as supplied by source 37 between electrodes 15 and 16, and the desired value for pressure in volume 13, to compute: (1) required changes in rate at which gas flows from supply 31 to volume 13, (2) required changes in the current supplied by source 25 to coil 21, and (3) required changes in the power supplied by source 37 between electrodes 15 and 16. These parameters, except plasma power, control the impedance of the plasma in volume 13. This is because the plasma impedance is a function of the pressure of the inert gas in volume 13, the magnetic field derived from target assembly 17, and other parameters which change the impedance only nominally compared to the effect of the magnetic field. The dependent, controlled variable that can be changed to control the impedance of the plasma in volume 13 is the intensity of the magnetic field supplied by coil 21, as well as pole pieces 22-24, to target 15.

The DC analog control signals to increase or decrease gas flow rate, coil current, and plasma power computed by CPU 57 are supplied to input-output section 55 by way of bus 58. Input-output section 55 includes a digital to analog converter (not shown) which supplies DC analog signals to control gas flow rate, coil current and plasma power to leads 61, 62 and 63, respectively. The gas flow rate signal on lead 61 is supplied to servovalve 32 to control the opening of the orifice therein, which in turn controls the flow rate of gas from supply 31 to volume 13. The signal on lead 62 is supplied to source 25, to control the magnitude of the DC current supplied by the source to coil 21. The DC signal on lead 63 is supplied to source 37 to control the power supplied by the source between electrodes 15 and 16. The control output signals increase or decrease the output of controlled devices to cause plasma pressure, plasma voltage, and plasma current to conform to the operator selected or programmed values for them.

Prior to considering the operation of the system of FIG. 1, consideration is given, by referring to FIG. 2, to the manner in which the initially planar emitting surface of target 15 erodes and the effect of erosion on the thickness of a coating applied to substrate 14 if no changes in the impedance of the plasma are made. In FIG. 2, target 15 is illustrated as initially including a planar emitting surface 61. As target 15 is used, it erodes so that planar surface 61 becomes pitted and assumes a concave shape. At the end of the life of target 15, the target has eroded to such an extent that concave surface 62 almost touches bottom face 63 of the target.

Indications of the thickness profiles deposited by target 15 onto substrate 14 for the initial planar configuration of target 15 and the final, concave configuration 62 of target 15 are respectively indicated by curves 64 and 65. Curves 64 and 65 indicate thickness of the coating as a function of position from center line 66 of substrate 14, assuming that the center line of the substrate is coincident with the axis of target 15. The horizontal axis of the plot associated with curves 64 and 65 indicates the distance from center line 66, while the initial and final coating profiles 64 and 65 are indicated as vertical displacements relative to horizontal axis 67.

Curve 64 indicates that when target 15 is initially installed with a planar face 61, there is a relatively uniform thickness of material coated onto substrate 14, depending on the distance between the substrate and surface 61. Curve 64 is symmetrical about center line or axis 66, having a local minimum on the axis, and peak values somewhat inside the center of emitting annular target 15. As target 15 erodes, however, there is a shadow effect of the target on atoms emitted thereby, due to cavitation. In addition, due to the curvature of the emitting surface associated with the concave erosion, different numbers of atoms are emitted from different portions of the emitting surface of the target. Thereby, the coating profile has a tendency to change, so that the final coating profile curve 65 has a much more non-uniform distribution of atoms than initial profile curve 64. On axis 66, curve 65 has a local minimum which is much lower than the local minimum on axis 66 of curve 64. The peak values of curve 65 are farther removed from axis 66 than the peak values for curve 64, approaching the radius of the target 15.

The present invention, by controlling the impedance of the plasma in processing volume 13, has a tendency to overcome the different distribution patterns associated with the erosion of target 15, by influencing the progressive erosion of the target and the position of the plasma relative to the target surface. In accordance with the present invention, control of the plasma impedance by control of the magnetic field of cathode assembly 17 enables the coating distribution for a target in the eroded condition indicated by curve 62 to tend to be of a shape similar to the distribution curve when target 15 is initially utilized. Thus, the distribution curves for planar surface 61 of target 15 and eroded surface 62 of the target have a tendency to be the same shape. In addition, the plasma voltage and current are controlled, so there is control of the deposition coating rate.

The automatic impedance control of the present invention allows any magnetic or non-magnetic materials to be used for target 15. For magnetic materials, saturation flux in the target is automatically established, regardless of the saturation levels of the magnetic target. The fringing field is automatically established to provide the proper plasma impedance to conform to programmed values, as described supra. Changes in the magnetic properties of target 15 due to erosion of the target and changes in the target temperature are automatically compensated.

Another advantage of the invention is that targets having relatively large thicknesses can be employed because the magnetic field supplied to the cathode is automatically adjusted to suit the cathode thickness within the capacity of electromagnet coil 21. Cathodes of different thicknesses can also be employed at different times because the magnetic field is automatically adjusted to different plasma requirements.

Another advantage of the invention is that pressure can be changed over a wide range, if desired. If it is necessary to apply a non-uniform coating to substrate 14 by depositing material from target 15 onto the substrate through a mask, fine definition can be achieved with a generally low gas pressure. If a step in the coating pattern achieved with a mask is to be enhanced, a higher gas pressure is desired, because there is greater scattering of ejected atoms from cathode target 15. Hence, in the present invention, a pressure is selected and maintained at a desired or programmed value, independent of the plasma voltage and current. Because the pressure is pre-selected, the effect of pressure on plasma impedance is compensated by controlling the magnitude of the magnetic field supplied to target 15 by assembly 17.

Another advantage of the present invention is that expensive interface equipment for driving transducers in the sputter coating apparatus and circuitry for interpreting these transducers to convert the transducer signals to discrete set points is eliminated. Values derived by the transducers are stored in CPU 57 in nearly real time.

If desired, the range of plasma voltage can extend from a very low voltage, less than 200 volts, to voltages in excess of 1,000 volts if the pressure in volume 13 is controlled, as well as the fringing field amplitude. In particular, as the pressure in volume 13 is decreased and the field intensity is decreased it is possible to increase the voltage applied to the plasma by source 37. As the plasma voltage is increased, there is a faster deposition rate of coating material onto substrate 14.

The control philosophy of the system of FIG. 1 is that the critical items of interest are the deposition rate and the distribution of the coating material on the substrate. Deposition rate and coating material distribution are not direct functions of power applied to the plasma. Instead, the deposition rate and coating distribution vary with the plasma voltage and current, assuming a fixed system geometry. For a given power, the rate and distribution differ if the voltage and current differ. For example, if the plasma power is 1 kilovolt-ampere, the rate and distribution are different if the voltage is 600 volts and the current is 1.67 amperes, compared to the rate and distribution for a voltage of 300 volts and a current of 3.33 amperes. The difference in rate and distribution is due to the volume, shape, and position of the plasma relative to the emitting surface of cathode target 15.

To control deposition rate and coating distribution accurately over a period of time, it is necessary to control both the plasma voltage and plasma current for a specific plasma power. Plasma voltage and plasma current for a given plasma power are a function of plasma impedance. Plasma impedance is a function of the geometry in processing volume 13, the gas pressure in volume 13, characteristics of the inert gas in volume 13 (e.g. ionization potential), contaminants in the working gas (e.g. oxygen and nitrogen), as well as the magnetic field density in the plasma and the position of the magnetic field relative to the emitting surface of target 15. It is correctly assumed that the geometry in processing volume 13 is constant, the gas of source 31 has predetermined characteristics, and there are few contaminants in the gas, by virtue of the pumping action of pump 41. Thus, the two variables that can be varied to control plasma impedance are the pressure of the working gas in volume 13 and the magnetic field applied by cathode assembly 17 to target 15 and volume 13.

In the past, because permanent magnets have generally been employed for the cathode assemblies, only the working gas pressure could be controlled. Control of only the working gas provides a narrow range of plasma impedance control. Also, it is improper to assume that the characteristics of the permanent magnet on the sputter coating operation remain constant because (1) target 15 is heated by bombardment of ions (2) the target erodes to have a decreasing cross-section, and (3) the target expands and contracts. Because of these factors there are changes in the field supplied by the permanent magnet to the target and to the vicinity of the target in processing volume 13. In the past, because of constantly varying plasma impedance due to these factors, a working voltage for the plasma would be selected and the plasma current would vary. Alternately, a working plasma current would be selected and the plasma voltage would vary. In either of these cases, the deposition rate and coating distribution vary and are not well controlled.

By using an electromagnet with closed loop control, together with closed loop control of pressure in volume 13, the plasma impedance can be controlled accurately. Accurate control of the plasma impedance allows selected and programmed operation at desired values of plasma voltage and plasma current, making possible programmed control of the deposition rate and distribution of coating material on substrate 14.

Automatic control of the operations of the apparatus illustrated in FIG. 1 is provided in accordance with the flow charts of FIGS. 3 and 4. When target 15 is initially installed, the operator supplies values to CPU 57 indicative of the desired plasma voltage, plasma current, and plasma pressure. In response to these operator controlled parameters, CPU 57 initializes the system, as indicated by operation 101. Initialization operation 101 is specifically indicated in FIG. 4. Initialization operation 101 can also be entered after all of the operations illustrated in FIG. 3 have been executed. In such case, the system is automatically initialized and the system continues to operate until it is automatically shut down due to target 15 being sufficiently eroded as to no longer be useful.

After the system has been initialized during operation 101, data values are sequentially read from input-output unit 55 to designated areas in the memory of CPU 57. In particular, the gas flow rate indicating signal on lead 35, the pressure signal on lead 52, the magnetic field intensity signal on lead 50, the current of coil 21 on lead 44, the plasma voltage on lead 45 and the plasma current on lead 46 are continuously loaded into designated locations in the memory of CPU 57. Because it is well known to sequentially read data values from a computer control system into designated memory locations, such operations are not illustrated in the flow chart of FIG. 3.

The first control operation performed by CPU 57 involves controlling the gas flow rate from source 31 into processing volume 13. To this end, the measured plasma pressure and desired plasma pressure values stored in designated portions of the memory of CPU 57 are read during operations 102 and 103 into an arithmetic unit (not shown) of CPU 57. The arithmetic unit compares the measured and desired plasma pressures during operation 104, to derive an error signal indicative of the algebraic difference between the two pressures. The error signal resulting from compare operation 104 is supplied to a proportional-integral-differential (PID) controller (not shown) of the arithmetic unit in CPU 57, operation 105. The PID controller derives a gas flow rate signal that is coupled from CPU 57 via bus 58 and input-output unit 55 to lead 61, to control the opening of variable orifice 32 in line 33. Thereby, the flow rate of gas from source 31 to volume 13 is controlled to the desired, preset value. PID control operation 105 varies the flow rate through conduit 33 automatically in the least amount of time, without overshoot or ringing effects.

Next, the plasma voltage is controlled in PID loop #2. The measured plasma voltage and desired plasma voltage stored in designated portions of the memory of CPU 57 are read during operations 106 and 107 into an arithmetic unit (not shown) of CPU 57. The arithmetic unit compares the values in operation 108 and derives an error signal, either plus, zero, or minus, having a magnitude proportional to the deviation between the desired and measured plasma voltages. The error signal is supplied to a second PID closed control loop (not shown) of CPU 57, and a multi-bit control signal is generated in operation 109. The control signal is coupled to input-output section 55, and there converted to an analog DC voltage, supplied via lead 62 to the programmable coil power supply 25. The analog signal thus generated causes the output voltage of power supply 25 to change (if the error signal of operation 108 is not zero), thereby causing the electromagnet 17 coil current to increase or decrease.

The coil current increase or decrease changes the fringing magnetic field 25 intensity, to in turn change the plasma concentration, and hence the plasma impedance. The plasma impedance changes to provide a plasma voltage exactly equal to the desired plasma voltage. The plasma voltage is measured by a current transformer transducer in the plasma power source 37. A signal indicative of plasma voltage is supplied via lead 45 to the input-output section 55, where it is multiplexed at high rate in sequence with other incoming signals, converted to multi-bit digital format by an analog-to-digital converter (not shown) and supplied to CPU 57, where the measured value is re-logged into the designated memory portion reserved for that value. Thus the actual plasma voltage is continually measured and compared to the desired plasma voltage, to control the plasma impedance through control of electromagnet 21 coil current. The current flowing through coil 21 is continually adjusted to drive the plasma voltage error signal toward zero in the second closed PID loop. The PID controller, through the use of proportional, integral, and derivative values, adjusts the controlled variable, i.e., coil current, in a manner to provide very quick (nearly real time) response, with minimal overshoot or ringing, to compensate for all other changes, such as in gas pressure and/or target temperature, that tend to change the plasma impedance, hence actual plasma voltage. Plasma voltage is always controlled to a preset and/or programmed value.

PID loop #3 reads the measured plasma current stored in a designated portion of CPU 57 during operation 110. The desired plasma current is read from another designated portion of CPU 57 during operation 111. In operation 112 the desired and measured plasma values are compared and an error signal (plus, minus, or zero), having a value proportional to the deviation between the measured and desired current values, is generated and supplied to a PID controller of CPU 57. During operation 113, the PID controller generates a multi-bit digital format control signal which is coupled to input-output section 55. The signal derived during operation 113 is converted by the digital-to-analog converter (not shown) of section 55 into an analog DC signal which is supplied by lead 63 to plasma power source 37. The analog signal on lead 63 selectively activates the power source to a higher or lower power level (if change is indicated).

The signal on lead 63, resulting from a change in power supplied to the magnetron device for a plasma with constant or slowly changing impedance, would normally change both the plasma voltage and the plasma current. However, the operation of PID loop #2 controls the plasma impedance and dictates that a change in plasma power can only result from a change in plasma current, assuming no change in the operator selected or programmed plasma voltage. If the plasma voltage tends to change in response to a change in the plasma current, PID loop #2 adjusts the plasma impedance accordingly to control the plasma voltage and maintain it constant. The indirect signal generated by PID loop #3 thus increases, decreases or does not change the plasma power and causes only a change in plasma current toward the operator selected or programmed value. The actual plasma current is measured by a current transformer transducer, and supplied via lead 46 back to the input-output section 55, where the analog signal is converted into multi-bit digital form and communicated to the CPU 57, where the value is placed back in the designated memory portion.

It is thus seen that three values, viz: (1) desired operating pressure, (2) desired operating voltage, and (3) desired operating current, are fed initially on CPU 57 by operator selection or preprogramming in accordance with desirable operation of the magnetron sputtering process with reference to deposition rate, material distribution, and target life. Three PID loops control the actual operation to the pre-programmed or selected values. In the described embodiment as illustrated in FIG. 3, the three PID loops are performed in sequence, one after the other after initialization of the system. During initialization operation 101 CPU 57 checks for new input or programmed desired values. These operations are performed quite rapidly, occurring several times per second, to provide an overall effect as though the PID loops were operating continuously. The sequential operation is a result of the type of CPU equipment chosen for the operation. As is apparent to those skilled in the computer art, the PID loops can operate simultaneously and continuously, if desired.

In a device actually constructed in accordance with the drawing the controlled values differ from the preselected values by less than one-half of one percent. When a change in the desired values is made, the time required for the measured values to closely match the new desired values is a function of the magnitude of the changes; in the contructed device such matching occurs generally in less than two seconds.

A complete cycle from initialization operation 101, until completion of the third PID loop 113, is referred to as a scan. At the end of a scan, the CPU 57 goes back to operation 101, and checks for new preselected or programmed values; a scan is then normally repeated. Each pre-selected or programmed desired value and each actual measured value has a unique address or position in the CPU 57 memory; each stored value is accessable from the memory to be displayed on any equipment compatible with the computer equipment used. Values can be displayed on a CRT screen, an analog meter, a digital display device, and/or can be printed by a compatible printer. A CRT display is particularly useful, because a display format can be programmed to present the pre-selected and actual values adjacent each other on the screen, so that the operation of the controlled process can be seen in nearly real time.

The operations associated with initialization operation 101 are illustrated in FIG. 4. The operations illustrated in the flow diagram of FIG. 3, except for initialization operation 101, insure that during a deposition process the system operates at or very near the desired values for plasma pressure, plasma voltage, and plasma current. Extensive further control is required to make such a system useful for automatic control of a cathode sputtering operation, e.g. in conjunction with a substrate transport system, to provide close control of depositions onto a series of differing material substrates to be coated in any of: a batch, a continuous flow manner, sequentially, or one-by-one. At some point, for instance, the plasma must be ignited into the deposition chamber. Then the deposition parameters must be closely controlled as the coating process is performed. After the process has been completed, the source must, at some point, be extinguished. This is true regardless of the type of substrate transport.

In a batch type processing vacuum deposition machine, wherein a large number of substrates are introduced in a single batch to be simultaneously coated, the plasma must be ignited after the batch of substrates has been loaded into the processing chamber, and after the chamber has been brought quickly to an operational state. This occurs after other functions, such as pump down and outgasing, have been performed. When the processing is complete, the plasma must be extinguished, so that the chamber can be vented and the substrate removed.

In a continuous flow type machine, the processing cycle can be very much longer, because substrates are introduced into the high vacuum chamber in a manner that does not seriously disturb the plasma. The substrates are moved continuously past plural deposition devices, such as the illustrated magnetron, and exit the chamber in a manner that does not seriously disturb the plasma. However, the plasma deposition process must be interrupted for replenishment of the target material that is eroded, for routine cleaning, and for maintenance of the several mechanisms involved in substrate transport and processing.

In a sequential one-by-one processing machine wherein substrates are sequentially and individually brought to a process station, the requirements for ignition, control and extinguishing the plasma are perhaps the most critical. Each deposition process must be nearly a duplicate of every other deposition process. If complete isolation of one deposition operation from other such sequential depositions is desired, the working gas pressure and all other deposition parameters must be re-established for each process.

In addition to the requirements for igniting, controlling, and extinguishing the plasma in such machines, it is very useful to monitor the process in such a way that the remaining life, or erosion state, of the target material is known. The distribution profile of material from a magnetron sputtering device is very strongly affected by the manner in which the target material erodes. One of the objects of the present invention is to provide a method of and means for controlling the distribution of material throughout the life of a target by close control of plasma parameters to substantially control the erosion of the target material. To accomplish this desirable end, it is necessary to program changes in the plasma parameters, i.e., pressure, voltage and current, based on real time information of the erosion state of the target material. Consequently, during initialization operation 101, illustrated in detail in FIG. 4, the erosion state of the target material is effectively measured at various times during the overall operation. Such erosion state information is then used in conjunction with pre-programmed emperical information, based on prior tests, to standardize the plasma parameters to produce the desired effect.

The closed loop control of operating plasma parameters is illustrated in the flow diagram of FIG. 3. This closed loop control incorporates primarily real time analog signal communication between input-output section 55 and various transducers and actuators for the process, with conversion to and from multi-bit digital information format at the input-output section 55 for communication with the multi-bit digitally based CPU 57. Other types of input-output devices can be used, e.g. discrete point control. In discrete control, a single bit is controlled by the CPU, e.g. the CPU switches an output to a machine either on or off. The output to the machine has voltage and power levels to operate a solenoid, an electric motor, a relay, or a number of other control devices that can initiate mechanical movements, valve operations, and so forth, to cause the machine to perform discrete functions in a desired manner and sequence. Such discrete outputs for machine control can be programmed to occur with reference to time or with reference to sensed machine states or both. Machine state is sensed by discrete inputs, whereby electrical signals from switches, proximity sensors, set point relay contacts, and many other devices, are converted at the input-output section 55 to single bit information at a voltage level used by the CPU, then stored in the CPU memory as single bit discrete information, either as on or off values. By using an array of discrete inputs and logic programming, the machine state, often termed system status, causes the machine to perform certain tasks for which it was designed in a planned, sequential, cyclic way. Such discrete sequential control is well known in the art; if such discrete sequential control is used in the present invention, the CPU could be a microprocessor, a programmable controller, or computer to control the sequence of operations of cyclic machinery.

Such cyclic control as has been described is used in the present invention, performed by the CPU 57 and the input-output section 55 to cause certain cyclic events to take place; exemplary of the events are turning on and off the plasma power source 37, opening and closing valves, and moving and placing substrates. The flow diagrams and modes of operation for such discrete control are not shown, as they are not part of the unique nature of the invention; however, these operations are referred to from time to time in the description of initialization process 101 and FIG. 4.

The first step 114 in the initialization operation, FIG. 4, is to determine the status of the process being performed by the machine of FIG. 1, i.e., (a) is the process being performed, (b) if the process is being performed is it ready to stop, (c) if the process is not being performed is it ready to start. This information is stored in the discrete machine status array in CPU 57 and determined by the programmed discrete operating sequence of the CPU. If the process performed by the apparatus of FIG. 1 is at a point in the programmed operating cycle such that the coating process is not operating and the plasma is off, the program goes from operation 114 to operation 127, which determines if a standardizing sequence is to be performed. If operation 127 determines that the standardizing sequence should not be performed. the program sequence returns to operation 114. If operation 114 determines that the plasma is on and the process is continuing, the program goes to operation 102, FIG. 3, to continue plasma control to selected or programmed values. If operation 114 determines that the system status is off but that the plasma is ready to be ignited for sputtering to begin, the program goes to operation 116.

To ignite the plasma in the vicinity of the target generally requires the plasma to have different conditions from those required during the sputtering process. Often a plasma will not ignite at the working gas pressure desired for sputtering, but the plasma can be sustained at the sputtering plasma pressure. It is often also true that the plasma will not ignite at a very low value of fringing magnetic field intensity, but will be sustained and operate for sputtering after ignition at a very low magnetic field intensity that might be desirable for coating substrates. It is therefore necessary to provide a unique programmed value for ignition pressure and/or ignition field intensity, to provide reliabe ignition. These values are known empirically, and are programmed into the CPU 57 memory at unique locations designated for that purpose.

In operation 116 the desired ignition pressure is read from the memory of CPU 57. In operation 117, PID loop #1, FIG. 3, is accessed to provide a smooth transition so that the working gas pressure is quickly and definitely established at the desired level. Then during operation 118 the actual pressure is compared to the desired ignition pressure; as long as the desired and measured pressures differ the program recycles to operation 117. When the actual pressure is equal to the desired ignition pressure, the program advances to operation 119 during which the desired ignition value for fringing field 25 or for coil 21 current is read and the coil current amplitude is controlled.

There are three possible different control philosophies for the current applied to coil 21 during operation 119. In the first a closed PID loop is programmed to read a desired value for fringing field 25, to compare that value to the actual magnetic field read by Hall plate 49 and supplied to the input-output section 55 on lead 50. The PID controller of CPU 57 responds to a digital signal indicative of the magnetic field read by plate 49 to generate an error signal used to increase or decrease an analog signal on lead 62 to control the current of DC power source 25 and coil 21, which in turn controls the magnetic flux, and the fringing field. The current of coil 21 is changed until the desired and measured values of the magnetic field ready by plate 49 agree. Alternatively, a PID loop is programmed to compare an input desired current for coil 21 with the actual coil current, as indicated by the signal on lead 44; the PID loop derives a control signal that is applied to lead 62 and which is varied until the desired and measured values for the coil current agree. Another alternative approach, found to be usually sufficient in practice, eliminates the need for a PID loop. A desired value for the current of coil 21 is programmed as a fixed value signal for lead 62. The fixed coil current is established for ignition regardless of target erosion status. Because this method is the most simple and least sophisticated of the three methods it is preferable if the magnetic field intensity must be raised to a higher value than desired for processing.

Operations 117, 118 and 119 are thus used to provide a unique pressure value for the working gas and a unique value of the fringing magnetic field 25, to provide conditions for plasma ignition.

Generally plasma ignition occurs more readily at relatively high gas pressures. However, there is a practical upper limit to the working gas pressure imposed by the fixed system design. The capacity of vacuum pump 41, the size of the pumping orifice, and the capacity of the gas supply servo valve 32 establish this upper limit. The magnitude of the magnetic fringing field 25, for purposes of plasma ignition, is based upon the fact that ignition occurs more readily at high values of fringing field. This is because large fringing fields form more efficient electron traps. It is often true that application of either method, higher pressure or higher field intensity, is adequate for plasma ignition. In some cases both may be used.

After plasma pressure and/or magnetic field intensity necessary for ignition have been established, the program advances to operation 120, during which the available open circuit voltage of plasma power source 37 is applied across the anode 16 and the target cathode 15. Because the available open circuit voltage of plasma power source 37 is the maximum voltage that can be supplied by the source, the maximum electron current now flows from target cathode 15 into the processing volume 13. The emitted electrons are trapped and move rapidly in spiral paths near the surface of cathode target 15 by virtue of the crossed magnetic and electrical fields in the vicinty of the target cathode. This energetic electron current in the presence of the working gas, usually argon, causes ionization of argon atoms in the gas, so that positively charged argon ions are formed, causing more available electrons to support a plasma discharge. Until a plasma discharge is ignited, the desired values for operating voltage and current, and any manipulations relative to plasma impedance have no meaning because the plasma completes the electrical circuit between anode 16 and target cathode 15. Only when the plasma is formed and becomes stable do stable plasma current, voltage and impedance exist.

After open circuit voltage from plasma power source 37 is applied across anode 16 and target cathode 15 with values of plasma pressure and magnetic field intensity necessary for ignition established, operation 121 senses for plasma ignition. To sense plasma ignition, the output voltage and current of plasma power supply 37 are monitored. An analog signal indicative of the output voltage of supply 37 is supplied by a reference DC analog signal on lead 45, thence to multiplexer 55, where it is converted and supplied to the CPU 57 memory. An analog signal indicative of the output current is supplied via lead 46 to unit 55, similarly processed and supplied to the CPU 57 memory. In operation 121 are monitored the values in the CPU 57 memory indicative of the measured current and voltage outputs of supply 37. Before plasma ignition occurs, the monitored values are the open-circuit voltage of plasma power source 37, and the extremely small or zero current. As the plasma ignites, the output voltage of source 37 falls to a new value, well below the open circuit voltage; the actual output voltage of source 37 is a function of the operating impedance of the ignited plasma. Also, as the plasma ignites, the plasma current indication rises from a near zero value to a value dependent on the impedance of the ignited plasma. This change in output voltage and current of plasma power source 37 causes the computer program to transfer from operation 122 to operation 102, FIG. 3, at which new values for plasma pressure, plasma voltage, and plasma current are established by operation of PID loops #1, #2 and #3; the new values are the desired values for sputtering.

When plasma ignition is sensed, the program also advances to timing operation 123. In operation 123, a clock internal to CPU 57 is accessed; the elapsed time from plasma ignition is recorded in an address of the CPU 57 memory assigned for that purpose. This elapsed time is compared to a pre-programmed time required for sputtering to continue, as stored in a separate memory address. This feature is used for batch processing machines, or sequential machines where substrates are positioned and processed one-by-one. It is not necessarily used for machines in which a controlled continuous flow of substrates passes by a process station. In this last case, the plasma is usually programmed so it remains ignited until an operator input directs that the process be discontinued. This timing operation is properly part of the discrete sequential operation of a cyclic machine, and not an integral part of the unique plasma process control of the present invention. The precise control of plasma parameters, hence deposition parameters provided by the teachings of the present invention, however, makes the timing of sputtering continuation a useful and accurate method to provide material thickness control for either batch or one-by-one substrate processing.

When the desired elapsed sputtering time for process has been met, the program advances to operation 124 during which the plasma power source 37 is turned off to extinguish the plasma. Operation 124 may also be performed immediately after operation 114, if, during operation 114 it was indicated that sputtering is to stop for any reason. After the plasma is extinguished during operation 124, the program returns to operation 114, while discrete machine control continues, causing desired sequencing of the machine; exemplary of steps now performed during operation 114 are removal of a finished substrate from the processing position and insertion of another, not processed substrate in the place of the removed substrate. When the discrete machine control indicates that processing is again to commence, the program advances to operation 116 to begin the process of plasma ignition as described supra.

After plasma ignition has been sensed during operation 121 and timing operation 123 has commenced, a mathematical sequence operation 125 is triggered to account for target life by elasped kilowatt hours of usage. In operation 125, plasma voltage, plasma current and elapsed time that a particular target has been used are multiplied together and accumulated. Operation 125 provides an approximate indication of target usage as a double check to prevent erosion completely through a target cathode 15. In operation 125, at convenient intervals of time, such as once a minute, the actual plasma voltage and the actual plasma current are read from the CPU 57 memory, where these values are updated on a several times per second schedule, the real current and voltage values are multiplied together, and the result multiplied by the time interval to derive a product that is added to a product of the same variables in a CPU memory location allocated to the purpose of recording elapsed kilowatt hours of a target cathode.

It is known empirically that a target cathode 15 composed of a certain material and of a certain thickness can be used an approximate number of kilowatt hours before the material is eroded to the point that the target cathode must be replaced to avoid damage that might occur if the target were allowed to erode further. This end-of-life emperical value is pre-programmed in the CPU memory 57. The accumulated life for a target cathode is compared to this pre-programmed value each time an increment of kilowatt hours is added to the accumulated life figure. When the accumulated life is equal to the safe pre-programmed value, a signal is triggered to warn an operator that the particular target cathode is near end-of-life and must be replaced. This feature aids an operator in planning machine service time so as to not interfere with planned production time. When a new target cathode is installed in a magnetron device, an operator generates a reset to index the pertinent accumulated life memory portion of CPU 57 to zero, to enable accounting for the new target cathode; operation 126.

The described accumulated kilowatt hour technique is previously known in the art. It is not the only or necessarily most accurate technique for indicating end-of-life for all target cathode materials. If target cathode 15 is composed of a magnetically permeable material, the present invention includes a more accurate approach for standardizing the deposition operation to account for the changes due to erosion throughout the life of the target cathode 15.

If during operation 114, it is determined that no sputtering is occurring, the program is sequenced to operation 127 during which a determination is made as to whether the process is to be standardized. Amongst the criteria for the determination of operation 127 are: (1) the elapsed sputtering time since the last previous standardization was performed, (2) the incremented life in kilowatt hours since the last such standardization, and (3) an operator decision on the basis of measured quality assurance procedures indicating a need for standardization. Once it is determined by CPU 57 that standardization is to be performed on a magnetic target, the program advances to operation 128 during which sputtering is stopped for a sufficient time for the magnetic target cathode 15 to cool to a temperature where the magnetic target is considered magnetically stable. This cooling of magnetic target cathode 15 is usually necessary because of the tendency of a magnetic material to exhibit varying magnetic properties at varying temperatures. The required cooling time is relatively short, on the order of a few seconds, for a cathode to cool to a temperature in substantial equilibrium with cooling water passages, now shown, in magnetron device 17.

After the cooling time has elapsed the program advances to operation 129 during which a pre-programmed signal is derived by CPU 57 and supplied to input-output section 55, causing a signal to be generated on lead 62 that activates coil power source 25 so the source supplies a predetermined current to electromagnetic coil 21. The predetermined coil current causes a certain magneto-motive force to be produced in a closed magnetic path formed by outer pole cylinder 23, pole disk 24, inner pole cylinder 22, and target cathode 15. The portions of the closed magnetic path, with the exception of target cathode 15, do not erode or otherwise change in use. The cross-sectional area and reluctance therefore, at all points in the closed magnetic path, with exception of the target cathode 15, remain constant. However, the cross-sectional area of target cathode 15 gradually decreases with use and erosion of the target, causing an increase in reluctance of the magnetic path.

All magnetically permeable materials have a finite capacity for coupling magnetic flux; this capacity (generally referred to as magnetic saturation) can be expressed, as an upper limit, in terms of flux per unit area as $B = \Phi/A$, where B is flux density, $\Phi$ is total flux in the circuit, and A is the cross-sectional area at a point in the magnetic path. When the present invention is used with magnetically permeable target materials, fringing field 25 is established by supplying a magneto-motive force to the magnetic circuit by feeding coil 21 with a current of sufficient magnitude to cause the magnetic flux density at a certain point in the target cathode 15 to reach this upper, saturation limit. At the value of coil current, hence magneto-motive force, at which saturation of target 15 occurs, the portion of the target cathode 15 toward pole cylinder 23 becomes an extension of pole cylinder 23; the portion of cathode 15 toward the inner pole cylinder 22 becomes an extension of pole cylinder 22. Magnetic poles of opposite polarity are immediately adjacent one another on the target surface on opposite sides of the saturation point. These opposite polarity magnetic poles in target 15 cause a fringing field to be established. The fringing field emanates from the target surface and is adjacent the target surface. As additional coil current is applied above the value causing saturation of the target material, no additional flux can be coupled by the target material itself at the point of saturation. The result is that the strength of the opposing magnetic poles at the opposite points in the target increases, causing the intensity of the fringing field to increase. The fringing field occurs both from above and below the target cathode 15, that is, to either side of the cathode. The operating plasma impedance is then controlled by varying the fringing field intensity by changing the current of coil 21, so it is always above the value required for saturation.

To measure erosion of a magnetic target 15 a fixed current for coil 21 has a value above the value required to saturate an uneroded target cathode. At this coil current, with an uneroded target, the fringing field intensity is measured by Hall plate 49. As magnetic target 15 erodes and the cross-sectional area at the point of saturation decreases, saturation occurs at a lower value of total flux. Therefore, more of the magnetic circuit magneto motive force appears on opposite sides of the saturation point in target 15 (which effectively functions as an air gap) than subsists on opposite sides of the saturation point for the uneroded target, even though there is no change in the current of coil 21. A higher fringing field intensity thus subsists across the gap after target erosion than prior to erosion. This effect of increasing fringing field intensity with increasing magnetic target erosion makes it crucial to standardize the plasma values with target erosion. The fringing field intensity measured at a pre-determined and fixed coil current is a direct indication of the thickness of the magnetic target material at the point of saturation, which is also the point of maximum erosion.

With the standardized current applied during operation 129, the program advances to operation 130 during which a signal indicative of fringing field intensity, as indicated by Hall plate 49 on lead 50, is coupled by input-output section 55 to the CPU 57 and stored at a predesignated memory address as target thickness. The actual target thickness is related to the fringing field intensity associated with the predetermined coil current by a set of empirical values stored in a preprogrammed look-up table in the CPU 57 memory. A periodic relatively frequent check is thereby made of the actual erosion condition of the magnetic target material. If the periodic check indicates excessive erosion, CPU 57 triggers an abort signal or a standby signal to prevent equipment damage or a possible safety hazard that might be possible if an almost completely eroded target cathode 15 were allowed to continue to operate.

The periodic measurement of the erosion condition of a magnetic target cathode 15 during operation 130 enables now updated desired values for operating pressure, plasma voltage, and plasma current to be entered (during operation 131) for the control deposition parameters of PID loops #1, #2 and #3. By empirical knowledge, a table of erosion correlated values of fringing magnetic field is pre-programmed into CPU 57 memory. Each time the erosion condition measurement is made, a comparison is made with this table. At certain points, referenced to target erosion, new values are automatically entered from the table into the memory addresses for desired operational plasma parameter values, so automatic compensation is made to provide deposition rate and material profile distribution within desired specifications. The program then returns to operation 114 of the initialization procedure in process control.

Although not specifically shown in the flow diagrams for the process control of FIG. 3 and FIG. 4, a similar procedure can be used for measuring erosion condition and standardization of a non-magnetic target cathode material.

For the case of a non-magnetic target material, fringing field 25 does not emanate from the target itself as an extension of the pole structures, but emanates from the ends of pole structures 22 and 23 adjacent target cathode 15. With non-magnetic targets this fringing field does not change dramatically with target temperature, nor do the position and intensity of the field change with target erosion. The position and strength of the fringing field relative to the cathode surface does however change with target erosion because the surface, as it erodes, is at different positions relative to the plasma confinement furnished by the field. As a non-magnetic target erodes and coil 21 current remains unchanged, the plasma impedance gradually changes as a function of target erosion. This impedance change causes a gradual decrease of plasma voltage unless the desired plasma voltage input is standardized periodically to target erosion. Standardizing operations 128–131 for a non-magnetic target material are performed with the plasma ignited because the fringing field is only affected by plasma impedance as such a target erodes. This is in contrast to magnetic target standardization which is performed without plasma ignition. For non-magnetic target materials, standardization may be initiated as described supra for magnetic materials as a function of (1) pre-programmed time intervals, and (2) accumulated kilowatt hours, or (3) the will of an operator.

With the plasma ignited at a pre-programmed standardized pressure, two additional methods can be used to monitor erosion of a non-magnetic target. In the first additional method, a standard current is supplied to coil 21, and the monitored plasma voltage at a pre-programmed plasma current is taken as an indication of erosion condition. It is known that, with a standard plasma pressure, coil current, and plasma current, the monitored plasma voltage is a direct indication of plasma impedance, and hence a direct indication of target erosion. Alternatively, the non-magnetic target erosion can be determined by providing a standard plasma voltage, a standard plasma pressuure, and a standard plasma current. The coil 21 current required to establish this condition is measured to indicate target erosion. In either of these cases, the result is compared to values in a table containing empirical data relating plasma voltage or coil current (for the standardized condition) to erosion. From the comparison new entries are made for desired pressure, plasma voltage and plasma current to provide control of deposition rate and material deposition profile within established specifications, per PID loops #1, #2 and #3.

The embodiments of the present invention have been illustrated and described with reference to a generally round, annular, and concentric cathode assembly 17, employing an electromagnetic by virtue of a wound coil that supplies the necessary magnetic field for plasma concentration and enhancement. The teachings of the present invention are equally applicable to cathode assemblies of other shapes and configurations, including those termed in the art as planar magnetrons, often of rectangular shape. Also, the present invention applies to cathode assemblies employing these principles to establish and control a plurality of plasma rings or paths, either on a single target material or with a plurality of targets. Additionally, a variable electromagnet, either a DC or AC powered, can be used in conjunction with permanent magnets to provide a total flux capability with part of the flux derived from a combination of permanent magnets and a variable electromagnet providing a limited range variation in the fringing field intensity. In addition, other means of varying the magnetic flux intensity can be used, such as mechanically positioning permanent magnets or creating controllable gaps in the return magnetic path.

While there have been described and illustrated certain specific embodiments of the invention, it is clear that variations in the details of the embodiment specifically illustrated and described may be made without departing from the true spirit and scope of the invention as defined in the appended claims.

The embodiments of the present invention have been described and illustrated with reference to a single magnetron device in a single chamber. It is obvious to those skilled in the art of vacuum system design and manufacture that the advantages of the present invention are particularly applicable to the case where it may be desired to apply a plurality of vacuum deposited coatings to a single substrate in a planned sequence. It is through precise control of plasma and deposition parameters, and the ability to repeat such sequential processes in a cyclic manner with the basic teachings of this invention that such sequential processing is feasible and economic. The teachings of the present invention are also particularly applicable when it may be desired that such sequential processes be totally isolated from one another, providing the ability to perform sequential sputtering operations that are not compatible with each other, such as DC magnetron deposition in one process, reactive deposition in another, and RF deposition of a dielectric material in another. With the invention, it is possible to plate, clean, outgas, and etch or perform other process steps, in the same in-line sequential flow.

We claim:

1. A method of controlling a sputter coating depositing apparatus including a target cathode, an anode and a plasma, ionizing electrons for the plasma having a tendency to be confined in proximity to an emitting surface of the target by a magnetic field having lines of flux adjacent the emitting surface of the target, the confining magnetic field intersecting electric field lines extending between the anode and cathode, the methode comprising controlling the electric impedance of the plasma by controlling the magnetic field intensity in response to a plasma parameter having a tendency to vary.

2. The method of claim 1 wherein the target is a magnetic material and the magnetic field intensity is sufficient to saturate the magnetic material and establish a magnetic fringing field in proximity to the emitting surface, the magnetic fringing field being the confining magnetic field.

3. The method of claim 1 wherein the parameter is a function of plasma power.

4. The method of claim 1 wherein the parameter is a function of plasma power, in turn a function of plasma current and voltage, comparing one of said functions of plasma power with a desired value therefor to control said one function of plasma power, and comparing the value of the one controlled plasma parameter with a desired value therefor to control the magnetic field intensity.

5. The method of claim 1 wherein the parameter is a function of plasma power, in turn a function of plasma current and voltage, comparing one of said functions of plasma power with a desired value therefor to derive a first error signal having a magnitude indicative of the deviation between actual plasma power and desired value for plasma power, controlling the magnitude of said one function of plasma power in response to the magnitude of the first error signal, comparing the value of the one controlled plasma parameter with a desired value therefor to derive a second error signal having a magnitude indicative of the deviation between the actual value of the one controlled plasma parameter and the desired value therefore, and controlling the magnetic field intensity in response to the magnitude of the second error signal.

6. A controller for a sputter coating depositing apparatus including a target cathode, an anode and a plasma, ionizing electrons for the plasma having a tendency to be confined in proximity to an emitting surface of the target by a magnetic field having lines of flux adjacent the emitting surface of the target, the confining magnetic field intersecting electric field lines extending between the anode and cathode, the controller including means for monitoring parameters of the plasma, and means responsive to the monitored plasma parameters for controlling the intensity of the magnetic field.

7. The controller of claim 6 wherein the means for monitoring includes means for monitoring the power of the plasma.

8. The controller of claim 6 wherein the means for monitoring includes means for monitoring the pressure of the plasma.

9. The controller of claim 6 wherein the means for monitoring includes means for monitoring a function of the power and pressure of the plasma.

10. The controller of claim 6 wherein the means for monitoring includes means for monitoring the voltage, current and pressure of the plasma.

11. The controller of claim 6 wherein the means for monitoring includes means for monitoring the magnetic field for electrons that ionize atoms of the plasma.

12. The controller of claim 6 wherein the means for monitoring includes means for monitoring the magnetic field for electrons that ionize atoms of the plasma, as well as a function of the plasma power.

13. The controller of claim 6 wherein the means for monitoring includes means for monitoring the magnetic field for electrons that ionize atoms of the plasma, as well as a function of the plasma power and plasma pressure.

14. The controller of claim 6 wherein the means for monitoring includes means for monitoring the magnetic field for electrons that ionize atoms of the plasma as well as the plasma current and voltage.

15. A method of coating substrates with a sputter coating apparatus which during operation establishes a magnetic field and a plasma, the apparatus including a target cathode with an atom emitting surface, atoms from the emitting surface being deposited on a substrate, the target eroding as it is used during deposition, a distribution pattern of the atoms on the substrate having a tendency to change as the target erodes, the method comprising from time to time standardizing certain parameters of the apparatus, determining a response of the apparatus while the apparatus is in the standardized condition, and comparing the response with predetermined values thereof to determine target erosion.

16. A method of controlling a sputter coating depositing apparatus including a target cathode, an anode and a plasma, ionizing electrons for the plasma having a tendency to be confined in proximity to an emitting surface of the target by a magnetic field having lines of flux adjacent the emitting surface, the confining magnetic field intersecting electric field lines extending between the anode and cathode, atoms from the emitting surface being deposited on a substrate, the target eroding as it is used during deposition, a distribution pattern of the atoms on the substrate having a tendency to change as the target erodes, the method comprising the step of changing the electric impedance of the plasma as the target erodes by changing the magnetic field in such a manner as to substantially overcome the tendency of the distribution pattern to change with target erosion, the electric impedance being changed in response to measurements indicative thereof and programmed values that change as a function of the amount of material sputtered from the target.

17. A method of controlling a sputter coating depositing apparatus including a target cathode, an anode and a plasma, ionizing electrons for the plasma having a tendency to be confined in proximity to an emitting surface of the target by a magnetic field having lines of flux adjacent the emitting surface, the confining magnetic field intersecting electric field lines extending between the anode and cathode, atoms from the emitting surface being deposited on a substrate, the target eroding as it is used during deposition, a distribution pattern of the atoms on the substrate having a tendency to change as the target erodes, the method comprising the steps of changing the electric impedance of the plasma as the target erodes by changing the magnetic field in such a manner as to substantially overcome the tendency of the distribution pattern to change with target erosion, from time to time deriving an indication of the target erosion while certain parameters of the apparatus are at a standardized condition, determining a response of the apparatus while the apparatus is in the standardized condition, and comparing the response with predetermined values thereof to determine target erosion.

18. The method of claim 17 further including responding to the determined target erosion to establish set point values for the apparatus, the established set point values being such that when the plasma is controlled in response to it the tendency of the distribution pattern to change with target erosion is substantially overcome.

19. The method of claim 17 wherein the target is magnetic and a predetermined magnetic field sufficient to saturate the target is supplied to the target in the standardized condition, and sensing the amplitude of a fringing field in the vicinity of the target resulting from the predetermined field to establish the set point value.

20. The method of claim 19 wherein the standardized condition is established without the plasma being ignited and while the cathode is at a stabilized, predetermined temperature.

21. The method of claim 19 further including controlling the magnetic field substantially at a set point value for it.

22. The method of claim 17 wherein the target is non-magnetic and the standardized condition is established with the plasma ignited and a predetermined pressure subsisting therein, and sensing an indication of the plasma while the standardized condition is established to determine the target erosion indication.

23. The method of claim 22 further including controlling the magnetic field so it is maintained substantially at the set point value, the amount of control for the magnetic field being an indication of the target erosion.

24. A method of controlling a sputter coating depositing apparatus including a magnetic target cathode, an anode and a plasma, ionizing electrons for the plasma having a tendency to be confined in proximity to an emitting surface of the target by a magnetic field having lines of flux adjacent the emitting surface, the confining magnetic field intersecting electric field lines extending between the anode and cathode, atoms from the emitting surface being deposited on a substrate, the method comprising applying a magnetic field to the target, the magnetic field having an intensity sufficient to saturate magnetic material of the target and establish a magnetic material of the target and establish a magnetic fringing field in proximity to the emitting surface, the magnetic fringing field being the confining magnetic field, and controlling the magnetic field in response to an indication of the plasma impedance.

25. The method of claim 24 wherein the target has a tendency to change temperature during operation, and changing the amplitude of the magnetic field so that the fringing field configuration has a tendency to be constant on a short term basis.

26. The method of claim 25 wherein the target erodes as it is used during deposition, a distribution pattern of the atoms on the substrate having a tendency to change as the target erodes, and changing the amplitude of the magnetic field so that on a long term basis the fringing field configuration changes in such a manner as to substantially overcome the tendency of the distribution pattern to change with target erosion.

27. A method of controlling a sputter coating depositing apparatus including a target cathode, an anode and a plasma, ionizing electrons for the plasma having a tendency to be confined in proximity to an emitting surface of the target by a magnetic field having lines of flux adjacent the emitting surface, the confining magnetic field intersecting electric field lines extending between the anode and cathode, atoms from the emitting surface being deposited on a substrate, the target eroding as it is used during deposition, a distribution pattern of the atoms on the substrate having a tendency to change as the target erodes, the method comprising from time to time standardizing certain parameters of the apparatus, determining a response of the apparatus while the apparatus is in the standardized condition, and comparing the response with predetermined values thereof to determine target erosion.

28. The method of claim 27 further including responding to the determined target erosion to establish set point values for the apparatus, the established set point values being such that when the plasma is controlled in response to it the tendency of the distribution pattern to change with target erosion is substantially overcome.

29. The method of claim 28 wherein the target is magnetic and a predetermined magnetic field sufficient to saturate the target is supplied to the target in the standardized condition, and sensing the amplitude of a fringing field in the vicinity of the target resulting from the predetermined field to establish the set point values.

30. The method of claim 29 wherein the standardized condition is established without the plasma being ignited and while the cathode is at a stabilized predetermined temperature.

31. The method of claim 28 wherein the target is non-magnetic and the standardized condition is established with the plasma ignited and a predetermined pressure subsisting therein, and sensing an indication of the plasma while the standardized condition is established to establish the set point values.

32. The method of claim 27 wherein the target is non-magnetic and the standardized condition is established with the plasma ignited and a predetermined pressure subsisting therein, and sensing an indication of the plasma while the standardized condition is established to determine the target erosion indication.

33. The method of claim 27 wherein the target is magnetic and a predetermined magnetic field sufficient to saturate the target is supplied to the target in the standardized condition, and sensing the amplitude of a fringing field in the vicinity of the target resulting from the predetermined field to determine the target erosion indication.

34. In combination, a sputter coating depositing apparatus including a target cathode, an anode and a plasma, ionizing electrons for the plasma having a tendency to be confined in proximity to an emitting surface of the target by a magnetic field having lines of flux adjacent the emitting surface of the target, the confining magnetic field intersecting electric field lines extending between the anode and cathode, and means for controlling the magnetic field intensity in response to plasma parameters having a tendency to vary.

35. In combination, a sputter coating depositing apparatus including means for mounting a target cathode, an anode and a plasma, ionizing electrons for the plasma having a tendency to be confined in proximity to an emitting surface of a target on the means for mounting, the electrons having a tendency to be confined by a magnetic field having lines of flux adjacent the emitting surface of the target, the confining magnetic field intersecting with electric field lines extending between the anode and cathode, a magnetic field sensor positioned in proximity to the cathode for sensing a fringing field of the cathode, and means for controlling a function of the plasma impedance in response to the magnetic field sensed by the magnetic field sensor.

36. Apparatus for controlling a sputter coating depositing device including a target cathode, an anode and a plasma, ionizing electrons for the plasma having a tendency to be confined in proximity to an emitting surface of the target by a magnetic field having lines of flux adjacent the emitting surface of the target, the confining magnetic field intersecting electric field lines extending between the anode and cathode, the apparatus comprising means for monitoring plasma parameters having a tendency to vary, and means for controlling the electric impedance of the plasma by controlling the magnetic field intensity in response to the means for monitoring 37. The apparatus of claim 36 wherein the parameter is a function of plasma power.

38. The apparatus of claim 36 wherein the parameter is a function of plasma power, in turn a function of plasma current and voltage, means for comparing a function of plasma power with a desired value therefor to control one of said functions of plasma power, and means responsive to a comparison of the value of the other of said functions of plasma power with a desired value therefor for controlling the magnetic field intensity.

39. The apparatus of claim 36 wherein the parameter is a function of plasma power, in turn a function of plasma current and voltage, means for comparing a function of plasma power with a desired value therefor to derive a first error signal having a magnitude indicative of a function of the deviation between actual plasma power and of a desired value for plasma power, means for controlling the magnitude of one of said functions of plasma power in response to the magnitude of the first error signal, means for comparing the value of the other of said functions of plasma power with a desired value therefor to derive a second error signal having a mangitude indicative of the deviation between the actual value of the other function of plasma power and the desired value therefore, and means for controlling the magnetic field intensity in response to the second error signal.

40. Apparatus for controlling a sputter coating depositing apparatus including a target cathode, an anode and a plasma, ionizing electrons for the plasma having a tendency to be confined in proximity to an emitting surface of the target by a magnetic field having lines of flux adjacent the emitting surface, the confining magnetic field intersecting electric field lines extending between the anode and cathode, atoms from the emitting surface being deposited on a substrate, the target eroding as it is used during deposition, a distribution pattern of the atoms on the substrate having a tendency to change as the target erodes, the control apparatus comprising means for controlling the electric impedance of the plasma as the target erodes by changing the magnetic field in such a manner as to substantially overcome the tendency of the distribution pattern to change with target erosion, means for measuring parameters controlled by the electric impedance, means for storing programmed values that change as a function of the amount of material sputtered from the target, the controlling means being responsive to the measured parameters and the programmed values.

41. Apparatus for controlling a sputter coating depositing apparatus including a target cathode, an anode and a plasma, ionizing electrons for the plasma having a tendency to be confined in proximity to an emitting surface of the target by a magnetic field having lines of flux adjacent the emitting surface, the confining magnetic field intersecting electric field lines extending between the anode and cathode, atoms from the emitting surface being deposited on a substrate, the target eroding as it is used during deposition, a distribution pattern of the atoms on the substrate having a tendency to change as the target erodes, the control apparatus comprising means for controlling the electric impedance of the plasma as the target erodes by changing the magnetic field in such a manner as to substantially overcome the tendency of the distribution pattern to change with target erosion, means for from time to time deriving an indication of the target erosion while certain parameters of the apparatus are at a standardized condition, means for determining a response of the depositing apparatus while the apparatus is in the standardized condition, and means for comparing the response with a predetermined value thereof to determine target erosion.

42. The apparatus of claim 41 further including means responsive to the determined target erosion to establish set point values for the sputter coating apparatus, the established set point values being such that when the plasma is controlled in response to it the tendency of the distribution pattern to change with target erosion is substantially overcome.

43. The apparatus of claim 41 further including means for sensing the amplitude of a fringing field in the vicinity of the target to establish the set point value.

44. The apparatus of claim 41 further including means for establishing the standardized condition without the plasma being ignited and while the cathode is at a stabilized, predetermined temperature.

45. The apparatus of claim 41 further including means for establishing the standardized condition with the plasma ignited and a predetermined pressure subsisting therein, and means for sensing an indication of the plasma impedance while the standarized condition is established to determine the target erosion indication.

46. In an apparatus for controlling a sputter coating depositing apparatus including a target cathode, an anode and a plasma, ionizing electrons for the plasma having a tendency to be confined in proximity to an emitting surface of the target by a magnetic field having lines of flux adjacent the emitting surface, the confining magnetic field intersecting electric field lines extending between the anode and cathode, atoms from the emitting surface being deposited on a substrate, the target eroding as it is used during deposition, a distribution pattern of the atoms on the substrate having a tendency to change as the target erodes, means for from time to time standardizing certain parameters of the apparatus, means for determining a response of the depositing apparatus while the apparatus is in the standardized condition, and means for comparing the response with a predetermined value thereof to determine target erosion.

47. The apparatus of claim 46 wherein the response determining means includes means for sensing the amplitude of a fringing field in the vicinity of the target.

48. The apparatus of claim 46 wherein the response determining means includes means for sensing the amplitude of a function of plasma power.

49. A method of coating substrates with a sputter coating apparatus which during operation establishes a magnetic field and a plasma, the method comprising controlling during sputtering the electric impedance of the plasma by controlling the magnetic field intensity in response to a plasma parameter having a tendency to vary.

50. The method of claim 49 wherein the parameter is a function of plasma power.

51. The method of claim 49 wherein the parameter is a function of plasma power, in turn a function of plasma current and voltage, comparing one of said functions of plasma power with a desired value therefor to control said one function of plasma power, and comparing the value of the one controlled plasma parameter with a desired value therefor to control the magnetic field intensity.

52. The method of claim 49 wherein the parameter is a function of plasma power, in turn a function of plasma current and voltage, comparing one of said functions of plasma power with a desired value therefor to derive a first error signal having a magnitude indicative of the deviation between actual plasma power and desired value for plasma power, controlling the magnitude of said one function of plasma power in response to the magnitude of the first error signal, comparing the value of the one controlled plasma parameter with a desired value therefor to derive a second error signal having a magnitude indicative of the deviation between the actual value of the one controlled plasma parameter and the desired value therefore, and controlling the magnetic field intensity in response to the magnitude of the second error signal.

53. A method of coating substrates with a sputter coating apparatus which during operation establishes a magnetic field and a plasma, the apparatus including a target cathode with an atom emitting surface, atoms from the emitting surface being deposited on substrates, the target eroding as it is used during deposition, a distribution pattern of the atoms on the substrates having a tendency to change as the target erodes, the method comprising the steps of changing the electric impedance of the plasma as the target erodes by changing the magnetic field in such a manner as to substantially overcome the tendency of the distribution pattern to change with target erosion, the electric impedance being changed in response to measurements indicative thereof and programmed values that change as a function of the amount of material sputtered from the target.

54. A method of coating substrates with a sputter coating apparatus which during operation establishes a magnetic field and a plasma, the apparatus including a target cathode with an atom emitting surface, atoms from the emitting surface being deposited on substrates, the target eroding as it is used during deposition, a distribution pattern of the atoms on the substrates having a tendency to change as the target erodes, the method comprising the steps of changing the electric impedance of the plasma as the target erodes by changing the magnetic field in such a manner as to substantially overcome the tendency of the distribution pattern to change with target erosion, from time to time deriving an indication of the target erosion while certain parameters of the apparatus are at a standardized condition, determining a response of the apparatus while the apparatus is in the standardized condition, and comparing the response with predetermined values thereof to determine target erosion.

55. A method of controlling a process for sputter coating substrates with an apparatus including a target cathode, an anode and a plasma, ionizing electrons for the plasma having a tendency to be confined in proximity to an emitting surface of the target by a magnetic field having lines of flux adjacent the emitting surface of the target, the confining magnetic field intersecting with electric field lines extending between the anode and cathode, the improvement comprising sensing a magnetic field in proximity to the target cathode to sense a fringing field of the target cathode, and controlling a function of the plasma impedance in response to the sensed magnetic field.

56. The combination of claim 35 wherein the magnetic field sensor comprises a Hall probe.

57. A magnetically enhanced sputter coating source comprising anode means, cathode means, magnetic means for forming a magnetic field in proximity to said cathode means, means for measuring magnetic field strengths, said measuring means being mounted in a position to provide a measurement of said magnetic field during operation of said source, said magnetic field forming means being adjustable to control said magnetic field in response to a measurement by said measuring means.

58. The controller of claim 6 wherein the means for monitoring includes means for monitoring the magnetic field for electrons that ionize atoms of the plasma as well as the plasma current, voltage and pressure.

* * * * *